US010923178B1

(12) United States Patent
Ben-Rubi

(10) Patent No.: US 10,923,178 B1
(45) Date of Patent: Feb. 16, 2021

(54) DATA STORAGE WITH IMPROVED WRITE PERFORMANCE FOR PREFERRED USER DATA

(71) Applicant: Western Digital Technologies, Inc., San Jose, CA (US)

(72) Inventor: Refael Ben-Rubi, Rosh Haayin (IL)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 16/802,638

(22) Filed: Feb. 27, 2020

(51) Int. Cl.
| | |
|---|---|
| *G06F 11/00* | (2006.01) |
| *G11C 11/408* | (2006.01) |
| *G11C 11/4093* | (2006.01) |
| *G06F 13/16* | (2006.01) |
| *G11C 11/56* | (2006.01) |
| *G11C 8/12* | (2006.01) |

(52) U.S. Cl.
CPC ...... *G11C 11/4085* (2013.01); *G06F 13/1673* (2013.01); *G11C 8/12* (2013.01); *G11C 11/4093* (2013.01); *G11C 11/5628* (2013.01); *G11C 11/5642* (2013.01)

(58) Field of Classification Search
CPC ... G06F 13/1673; G11C 8/12; G11C 11/4093; G11C 11/5628; G11C 11/5642
USPC .................................................. 365/189.011
See application file for complete search history.

(56) References Cited

U.S. PATENT DOCUMENTS

| | | | |
|---|---|---|---|
| 8,423,866 B2 | 4/2013 | Dusija et al. | |
| 9,152,496 B2 | 10/2015 | Kanade et al. | |
| 9,235,470 B2* | 1/2016 | Bhalerao | G06F 12/0246 |
| 9,548,105 B1 | 1/2017 | Lee et al. | |
| 9,563,367 B2 | 2/2017 | Chu et al. | |
| 2019/0294363 A1 | 9/2019 | Caraccio et al. | |

FOREIGN PATENT DOCUMENTS

TW          201435730 A       9/2014

* cited by examiner

*Primary Examiner* — Xiaochun L Chen
(74) *Attorney, Agent, or Firm* — Patterson & Sheridan, LLP; Steven H. Versteeg

(57) ABSTRACT

The present disclosure generally relates to enhanced write performance by taking into consideration user write performance preferences as well as enhanced post write read (EPWR) scheduling. The user provides the write performance preferences to the data storage device. When a write operation happens, the data storage device checks the write performance preference for the current LBA as well as the write performance preference for the previous LBA. The data storage device will also check whether the current word line is scheduled for EPWR. Based upon the write performance preferences for the LBAs and the EPWR scheduling, the data can be written out of order to meet the user's write performance preferences. If the data is written out of order, the flash translation layer (FLT) is informed of the switch.

20 Claims, 4 Drawing Sheets

US 10,923,178 B1

DATA STORAGE WITH IMPROVED WRITE PERFORMANCE FOR PREFERRED USER DATA

BACKGROUND OF THE DISCLOSURE

Field of the Disclosure

Embodiments of the present disclosure generally relate to improving write performance using user preferences and enhanced post write read (EPWR).

Description of the Related Art

Data storage devices, including flash memory devices, write user data to memory devices within the data storage device. User data is also read from the memory devices in the data storage device. Once no longer needed, user data is erased from the memory device in the data storage device.

Users expect that the write operations for all logical block addresses (LBAs) will have the same write performance. However, not all LBAs will have the same write performance. Some writes will occur on word lines that have EPWR requirements while other word lines will not have EPWR requirements.

The user will typically have some data where write performance is more important than other data. Additionally, the user will typically have some data where the write performance is not much of a concern relative to data with a high write performance preference. Currently, the user's write performance preferences are not considered. Rather, the user data is simply written, regardless of user's write performance preferences and regardless of EPWR schedules.

Therefore, there is a need in the art to consider user write performance preferences for write operations.

SUMMARY OF THE DISCLOSURE

The present disclosure generally relates to enhanced write performance by taking into consideration user write performance preferences as well as enhanced post write read (EPWR) scheduling. The user provides the write performance preferences to the data storage device. When a write operation happens, the data storage device checks the write performance preference for the current LBA as well as the write performance preference for the previous LBA. The data storage device will also check whether the current word line is scheduled for EPWR. Based upon the write performance preferences for the LBAs and the EPWR scheduling, the data can be written out of order to meet the user's write performance preferences. If the data is written out of order, the flash translation layer (FLT) is informed of the switch.

In one embodiment, a data storage device comprises: a memory device; and a controller coupled to the memory device. The controller is configured to: receive user write performance preferences for two or more logical block addresses (LBAs) to be written; receive a first write command for a first LBA of the two or more LBAs; receive a second write command for a second LBA of the two or more LBAs; determine whether current word line of the memory device is a word line that needs enhanced post write read (EPWR); and write the second LBA to the current word line, wherein the first LBA remains in a buffer while the second LBA is written.

In another embodiment, a data storage device comprises: a memory device; and a controller coupled to the memory device. The controller configured to: determine whether a first LBA of a plurality of LBAs has a write performance preference; determine whether a second LBA of the plurality of LBAs have a write performance preference; determine whether a current word line of the memory device needs enhanced post write read (EPWR); and determine whether to write the second LBA to the current word line prior to writing the first LBA to the memory device.

In another embodiment, a data storage device comprises: a memory device; means to determine whether LBAs have write performance preferences; means to determine whether a current word line of the memory device needs enhanced post write read (EPWR); and means to write LBAs to the current word line out of order based upon write performance preferences.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to enhanced write performance by taking into consideration user write performance preferences as well as enhanced post write read (EPWR) scheduling. The user provides the write performance preferences to the data storage device. When a write operation happens, the data storage device checks the write performance preference for the current LBA as well as the write performance preference for the previous LBA. The data storage device will also check whether the current word line is scheduled for EPWR. Based upon the write performance preferences for the LBAs and the EPWR scheduling, the data can be written out of order to meet the user's write performance preferences. If the data is written out of order, the flash translation layer (FLT) is informed of the switch.

Figure 1:
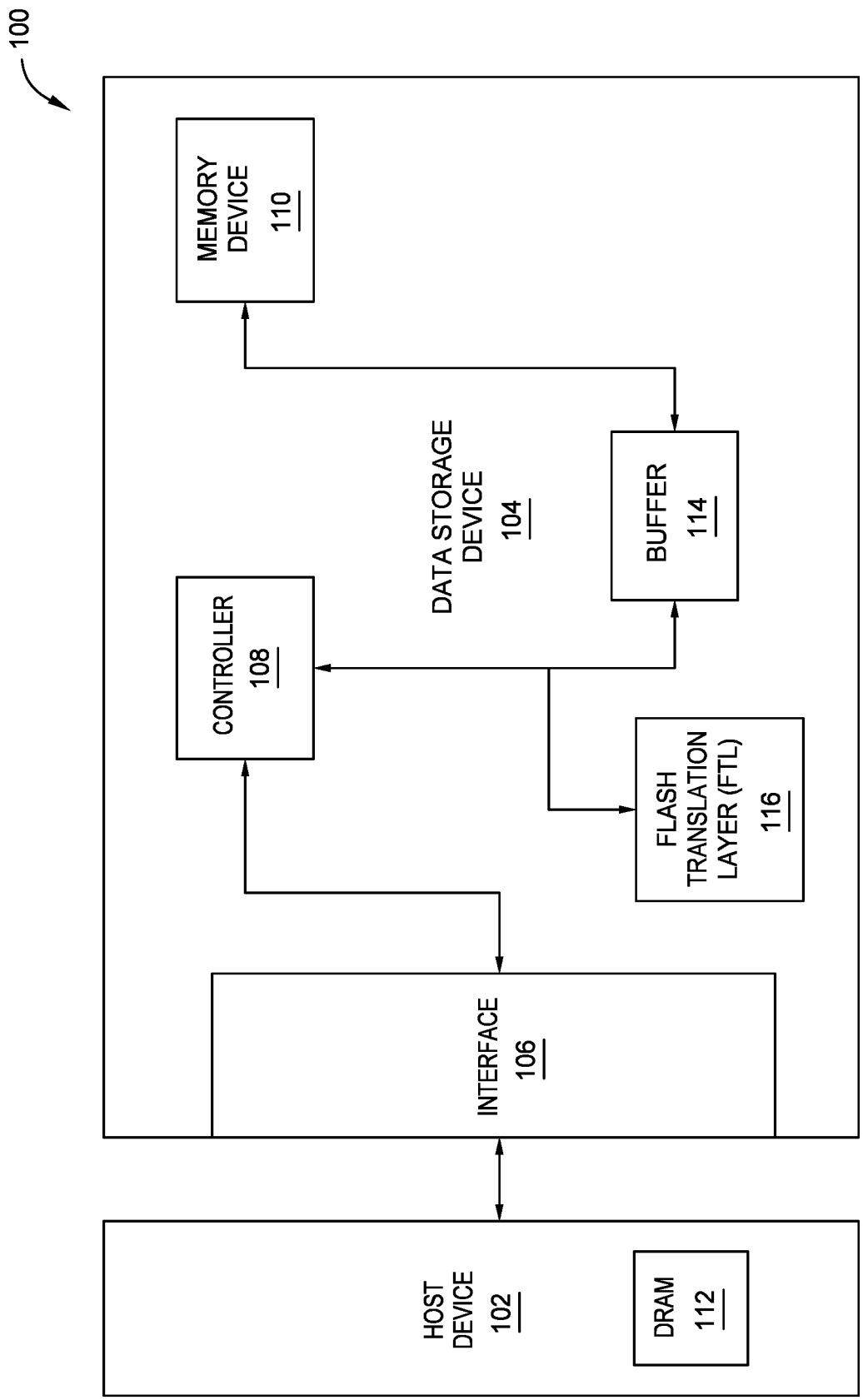
FIG. 1 is a schematic illustration of a system according to one embodiment.

FIG. 1 is a schematic illustration of a system 100 according to one embodiment. The system 100 includes a host device 102 and a data storage device 104. The host device 102 includes a dynamic random-access memory (DRAM) 112. The host device 102 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host device 102 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

The data storage device 104 communicates with the host device 102 through an interface 106 included in the data storage device 104. The data storage device 104 includes a controller 108, a buffer 114, a flash translation layer (FTL) 116, and one or more memory devices 110. The data storage device 104 may be an internal storage drive, such as a notebook hard drive or a desktop hard drive. Data storage device 104 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Data storage device 104 may take the form of an embedded mass storage device, such as an eSD/eMMC embedded flash drive, embedded in host device 102. Data storage device 104 may also be any other type of internal storage device, removable storage device, embedded storage device, external storage device, or network storage device.

Memory device 110 may be, but is not limited to, internal or external storage units. The memory device 110 relies on a semiconductor memory chip, in which data can be stored as random-access memory (RAM), read-only memory (ROM), or other forms for RAM and ROM. RAM is utilized for temporary storage of data whereas ROM is utilized for storing data permanently. Write performance preferences for LBAs may be stored in RAM. The memory device 110 includes one or more regions. An example of a region is a block, such as a NAND flash erase block of storage elements. A storage region may have a single-level cell (SLC) configuration, a multi-level cell configuration (MLC), a triple-level cell (TLC) configuration, or a quad-level cell (QLC) configuration. Furthermore, some memory devices may have more than one storage region type and is not limited to having a uniform storage region type (i.e., having both SLC and TLC).

Data storage device 104 includes a controller 108 which manages operations of data storage device 104, such as writes to or reads from memory device 110. The controller 108 executes computer-readable program code (e.g., software or firmware) executable instructions (herein referred to as "instructions") for the transfer of data. The instructions may be executed by various components of controller 108 such as processor, logic gates, switches, application specific integrated circuits (ASICs), programmable logic controllers embedded microcontrollers, and other components of controller 108.

Data storage device 104 includes a buffer 114 which is a region of physical memory storage used to temporarily store data while it is being moved from one place to another (i.e., from host device 102 to memory device 110).

Data storage device 104 includes a flash translation layer (FTL) 116 which is a hardware/software layer coupled with the controller 108. In some embodiments, the FTL 116 performs logical-to-physical address translation, garbage collection, wear-leveling, error correction code (ECC), bad block management, among other functions. The logical-to-physical address translation relates to the mapping of logical addresses from the file system to physical addresses of the memory device 110, such as NAND flash memory.

Data may be transferred to or from the DRAM 112 of the host device 102 to the data storage device 104. One data transfer pathway may originate from the DRAM 112 of the host device 102 and communicate through the interface 106 of the data storage device 104 to the controller 108. The data will then pass through the buffer 114 of the data storage device 104 and be stored in the memory device 110. The controller 108 is configured to update the FTL 116 translation table of the data locations of the within a memory device 110.

Figure 2:
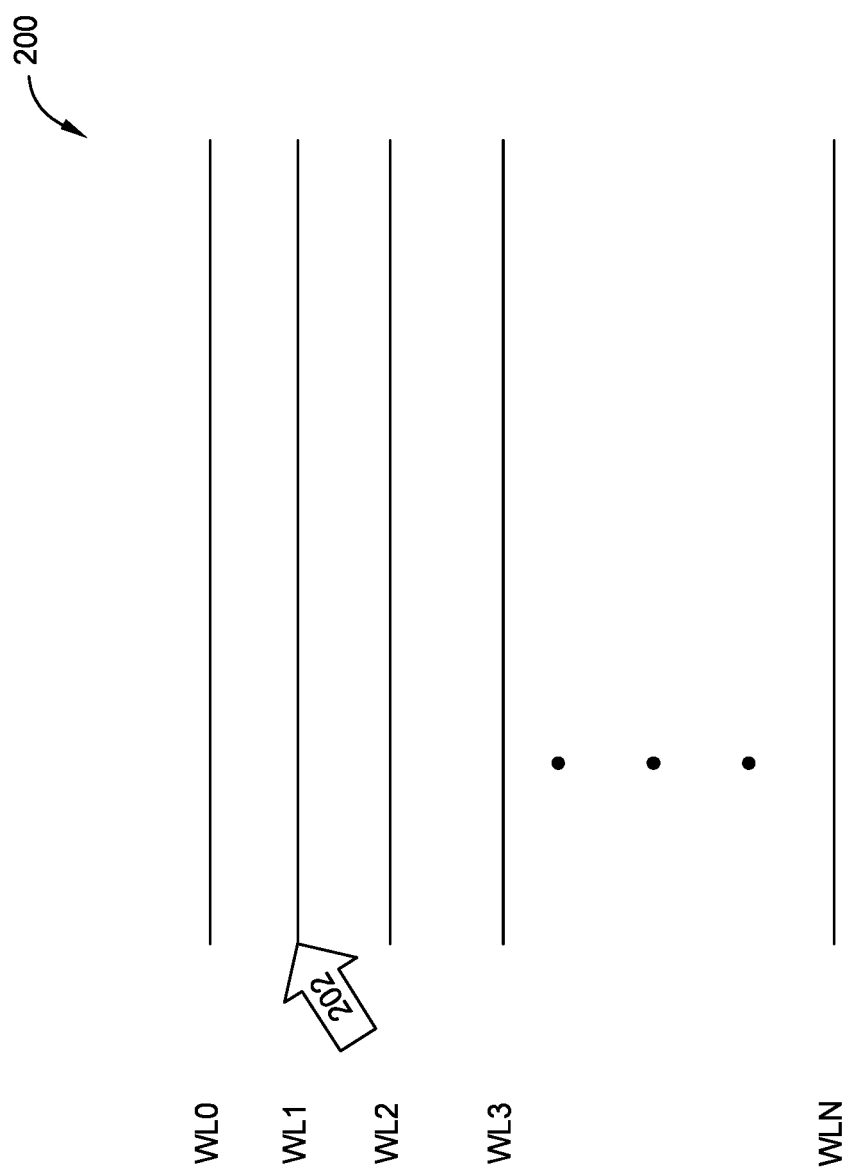
FIG. 2 is a schematic illustration of a page having a plurality of word lines according to one embodiment.

FIG. 2 is a schematic illustration of a page 200 having a plurality of word lines according to one embodiment. The memory device 110 of FIG. 1, such as NAND flash memory, comprises one or more dies. Each of the one or more dies comprises one or more planes. Each of the one or more planes comprises one or more erase blocks. Each of the one or more erase blocks comprises a plurality of word lines (e.g., 256 word lines) arranged in one or more pages. For example, an MLC NAND die may use upper page and lower page to reach the two bits in each cell of the full word line (e.g., 16 kB per page). Furthermore, each page can be accessed at a granularity equal to or smaller than the full page. A controller can frequently access NAND in user data granularity LBA sizes of 512 bytes. Thus, as referred to throughout, NAND locations are equal to a granularity of 512 bytes. As such, an LBA size of 512 bytes and a page size of 16 kB for two pages of an MLC NAND results in about 16 NAND locations per word line. However, the NAND location size is not intended to be limiting, and is merely used as a non-limiting example. Data is generally written sequentially to the word lines on a page (i.e., in the order of WL0 to WL1 to WL2 and so forth).

The word lines, such as WL0 and WL1, of page 200 may have differing write capabilities or performances. The word lines may have a high performance write capability or a low performance write capability. The write pointer 202 points to the next location to which data is to be written. The controller registers which word line on a page, such as WL1 on page 200, has a high performance write capability or which word line on a page 200 has a low performance write capability, such as WL2 on page 200. WL1 and WL2 are examples meant to be a possible embodiments of a write performance capability on a page. The write performance capability of a word line may differ based on the program cycle, wear, and other factors not listed attributing to its write performance capabilities.

The logical block address (LBA) is the logical address of the physical location of the data that is being stored. As data is written to a word line, such as WL0 within a page 200, the LBA is updated within the FTL 116 translation table. Data is written to the specific location at which the write pointer 202 points. The write pointer 202 moves sequentially through the word lines of a page to fill them to capacity, such as WL0 will be filled to capacity before the pointer moves to WL1.

Figure 3:
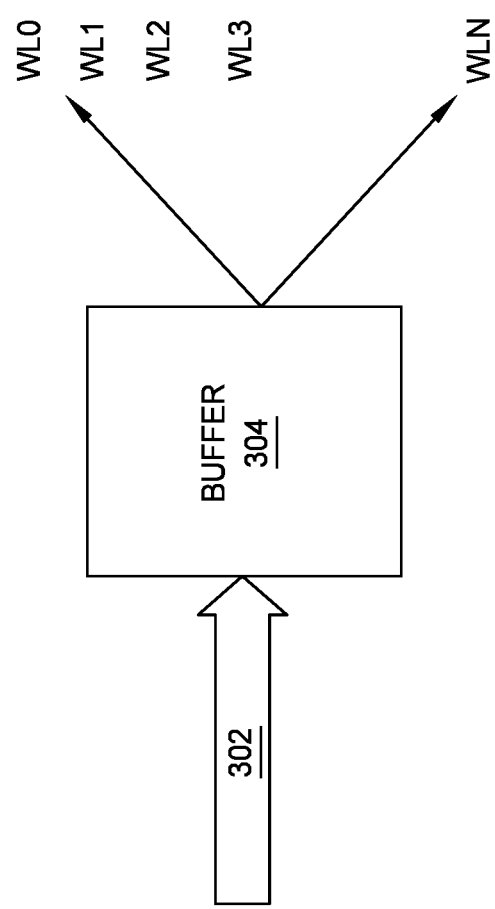
FIG. 3 is a schematic illustration of a sequence for improving write performance for preferred user data according to one embodiment.

FIG. 3 is a schematic illustration of a sequence for improving write performance for preferred user data according to one embodiment. The aspects of FIG. 3 include a data stream 302 of incoming data to be written, a buffer 304 within which data is temporarily stored until written to the memory device, and a page, such as page 200 of FIG. 2. The data stream 302 contains data sent by the host device, such as the host device 102 of FIG. 1, to the data storage device, such as the data storage device 104 of FIG. 1. The buffer 304 contains the data entering before releasing the data to be written to a word line, such as WL0.

A controller, such as the controller 108 of FIG. 1, may be coupled with the buffer 304 to determine the write preference of the user, the LBA write performance preference, and the word line write capability performance. Furthermore, the controller may determine if the word line requires an enhanced post write read (EPWR) which is an error check by the decoder on the previously written data to a word line. If the decoder is able to fully read the previously written data, then the write is validated. The previously written data may have an effect on the current data being written to either the same word line or the next word line. If the EPWR on the previous written data results in a fail, as in the previously written data has a program error, the controller may either re-write the data to the next available spot in a word line if the data is still in the buffer and has not be re-written, or request the data from the host to be re-written to the next available spot in a word line.

Furthermore, the controller, such as the controller 108 of FIG. 1, may be coupled with a FTL, such as the FTL 116 of FIG. 1. As data is written to a word line, the FTL records the location of the LBA in a translation table. As LBAs are written and re-written, the translation tables are updated to reflect the current position of each LBA. The user may set ranges for write performance preference so that the controller registers which LBA corresponds to a high write performance preference and which LBA corresponds to a low write performance preference. LBAs may have a high write performance preference or a low write performance preference. The LBA write performance preference may affect how the data is written to the word lines. For example, in the case of a high write performance preference LBA (received from host first) and a low write performance preference LBA (received from host second) both being written to a low write capability word line, the controller may instruct the buffer to release the low write performance preference LBA first (out of order received) so that it may be written to the low write capability word line.

The controller, such as the controller 108 of FIG. 1, may have a time barrier associated with a maximum time that data can stay in the buffer before being written to a word line. In other words, regardless of the write performance preference of the LBA, the LBA will be written to whichever word line, high write capability or low write capability, the pointer is pointing to after the maximum time has passed.

Figure 4:
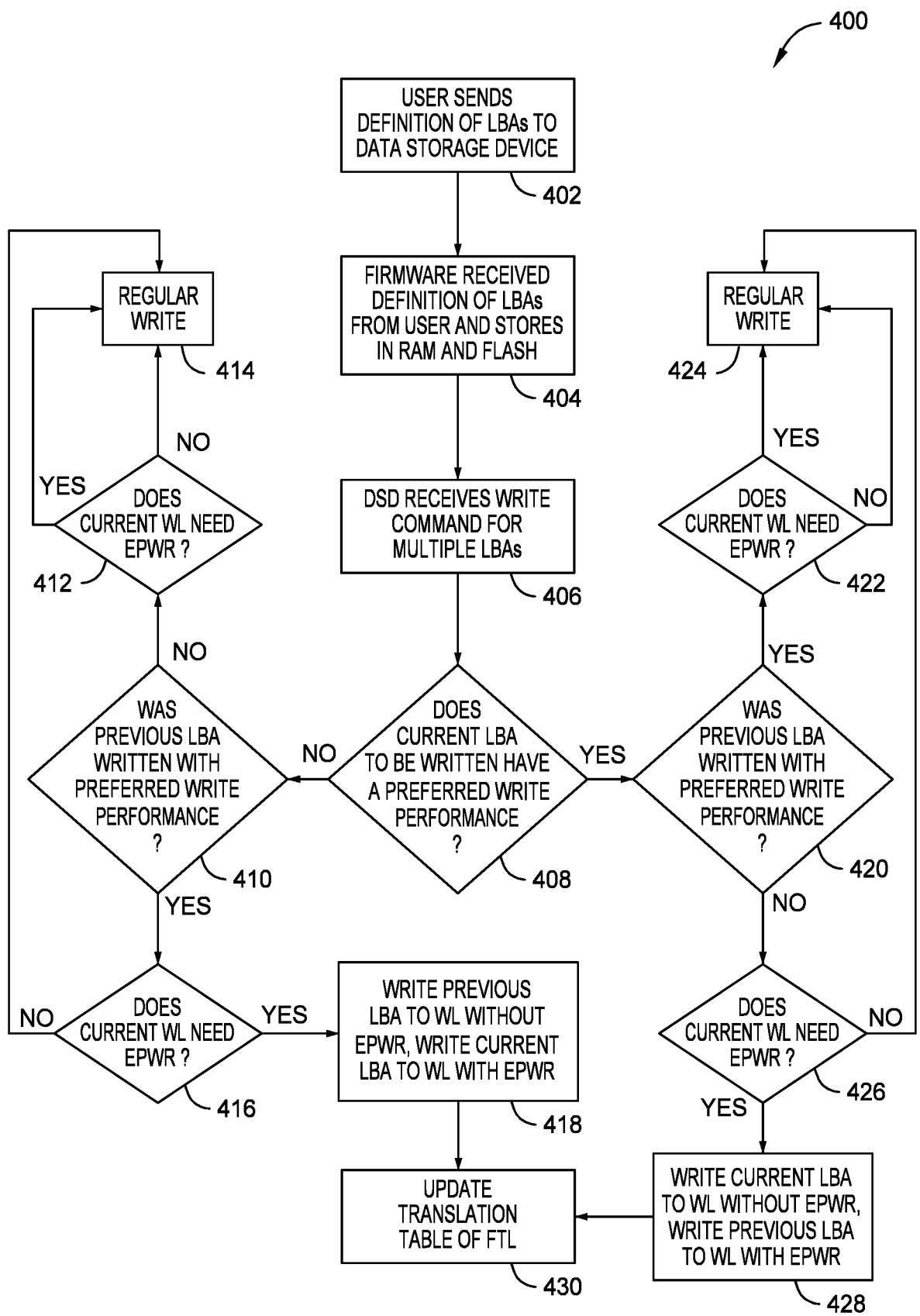
FIG. 4 is a flowchart illustrating a method of the sequence of FIG. 3.

FIG. 4 is a flowchart 400 illustrating a method of the sequence of FIG. 3. The system 100 of FIG. 1 and the page 200 of FIG. 2 will be referenced in accordance with FIG. 4 to describe the method of LBA storage depicted in FIG. 3. At block 402, the user sends a definition of LBAs to the data storage device. The definition of LBAs may consist of a user preference such as a range of LBAs that are considered high performance or preferred and a range of LBAs that are considered low performance or not preferred. The user definition of LBAs is received by the firmware and stored in the RAM and flash memory at block 404. In order to access the user definition, the controller, such as the controller 108 of FIG. 1, may interface with the RAM and flash memory to determine the performance preference of the incoming LBAs in the data stream 302.

The data storage device (DSD), such as the data storage device 104 of FIG. 1, may receive multiple write commands for multiple LBAs (i.e., two or more LBAs) at block 406. The data is held at the buffer, such as the buffer 114 of FIG. 1 or the buffer 304 of FIG. 3, before being written to the word line. The LBAs will be written to the current location of the pointer, such as the pointer 202 of FIG. 2.

The controller, such as the controller 108 of FIG. 1, determines the write preference of each LBA in the buffer as well as the write capability of the word line that the pointer is on at block 408. The controller may re-order the LBAs so that a not preferred LBA may be written to a low write capability word line and a preferred LBA may be written to a high write capability word line. If the order of LBAs is rearranged from the original sequence, the new order will be communicated to the FTL, such as the FTL 116 of FIG. 1, so that the embedded translation table will reflect the accurate location of the LBAs.

If the current LBA does not have a preferred write performance, then at block 410, the controller will determine if the previous LBA written had a preferred write performance. If the previous LBA did not have a preferred write performance, then at block 412, the controller will determine if the current word line being written to needs EPWR. However, whether the current word line needs or does not need EPWR, a regular write of the current LBA will occur at block 414 to the current word line.

If the previous LBA written had a preferred write performance at block 410, the controller will determine if the current word line needs EPWR at block 416. If the current word line does not need EPWR, the LBA can be written regularly to the current word line at block 414. However, if the current word line needs EPWR, then at block 418, the previous LBA will be written to the word line without EPWR and the current LBA will be written to the word line with EPWR. Furthermore, the translation table of the FTL will be updated with the location of the LBA at block 430.

However, at block 408, if the controller recognizes that the current LBA to be written has a preferred write performance, then the controller will determine if the previous LBA written had a preferred write performance at block 420. If the previous LBA was written with a preferred write performance, then at block 422, the controller will decide if the current word line needs EPWR. Regardless of the need of EPWR, the LBA will be written regularly to the word line at block 424.

If the previous LBA written did not have a preferred write preference at block 420, then controller determines if the current word line needs EPWR at block 426. The current LBA will be written regularly to the current word line at block 424 if the current word line does not need EPWR. However, if the current word line needs EPWR at block 426, then the current LBA will be written to the word line without EPWR and the previous LBA will be written to the word line with EPWR at block 428. The location of the current LBA written to the current word line will be updated in the translation table of the FTL at block 430.

In one embodiment, a data storage device comprises: a memory device; and a controller coupled to the memory device. The controller is configured to: receive user write performance preferences for two or more logical block addresses (LBAs) to be written; receive a first write command for a first LBA of the two or more LBAs; receive a second write command for a second LBA of the two or more LBAs; determine whether current word line of the memory device is a word line that needs enhanced post write read (EPWR); and write the second LBA to the current word line, wherein the first LBA remains in a buffer while the second LBA is written. The second LBA has a write performance preference that is higher than the write performance preference for the first LBA. The current word line needs EPWR. The current word line does not need EPWR and wherein the next word line needs EPWR. The user write preferences are stored in RAM. The controller is further configured to update a translation table of a flash translation layer (FTL) regarding the second LBA being written prior to the first LBA. The controller is further configured to write the first LBA to another word line of the memory device and perform EPWR on the written first LBA.

In another embodiment, a data storage device comprises: a memory device; and a controller coupled to the memory device. The controller configured to: determine whether a first LBA of a plurality of LBAs has a write performance preference; determine whether a second LBA of the plurality of LBAs have a write performance preference; determine whether a current word line of the memory device needs enhanced post write read (EPWR); and determine whether to write the second LBA to the current word line prior to writing the first LBA to the memory device. The controller is configured to determine that the first LBA has a preferred write performance preference. The controller is configured to determine that the second LBA does not have a write performance preference. The controller is configured to determine that the current word line needs EPWR. The controller is configured to write the second LBA to the current word line with EPWR. The controller is configured to determine that the first LBA does not have a preferred write performance preference. The controller is configured to determine that the second LBA has a write performance preference. The controller is configured to determine that the current word line needs EPWR. The controller is configured to write the first LBA to the current word line with EPWR.

In another embodiment, a data storage device comprises: a memory device; means to determine whether LBAs have write performance preferences; means to determine whether a current word line of the memory device needs enhanced post write read (EPWR); and means to write LBAs to the current word line out of order based upon write performance preferences. The data storage device further comprises means to update a translation table of a flash translation layer (FTL) based upon the means to write LBAs to the current word line out of order. The data storage device further comprises means to receive user write performance preferences for LBAs; and means to store user write performance preferences for LBAs. The means to write LBAs to the current word line out of order is also based upon whether the current word line of the memory device needs EPWR.

By taking into account the user's preferences for write performance write performance can be improved over simply writing data in order of receipt by a buffer to the next available word line.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a memory device; and
   a controller coupled to the memory device, the controller configured to:
   receive user write performance preference data for two or more logical block addresses (LBAs) to be written;
   receive a first write command for a first LBA of the two or more LBAs;
   receive a second write command for a second LBA of the two or more LBAs, wherein a flash translation layer (FLT) maps LBAs to word lines;
   determine whether current word line of the memory device is a word line that needs enhanced post write read (EPWR); and
   write the second LBA to the current word line, wherein the first LBA remains in a buffer while the second LBA is written.

2. The data storage device of claim 1, wherein the second LBA has a write performance preference that is higher than the write performance preference for the first LBA.

3. The data storage device of claim 2, wherein the current word line needs EPWR.

4. The data storage device of claim 3, wherein the current word line does not need EPWR and wherein the next word line needs EPWR.

5. The data storage device of claim 1, wherein the user write preferences are stored in RAM.

6. The data storage device of claim 1, wherein the controller is further configured to update a translation table of the flash translation layer (FTL) regarding the second LBA being written prior to the first LBA.

7. The data storage device of claim 1, wherein the controller is further configured to write the first LBA to another word line of the memory device and perform EPWR on the written first LBA.

8. A data storage device, comprising:
   a memory device; and
   a controller coupled to the memory device, the controller configured to:
   determine whether a first LBA of a plurality of LBAs has a write performance preference;
   determine whether a second LBA of the plurality of LBAs have a write performance preference;
   determine whether a current word line of the memory device needs enhanced post write read (EPWR); and
   determine whether to write the second LBA to the current word line prior to writing the first LBA to the memory device.

9. The data storage device of claim 8, wherein the controller is configured to determine that the first LBA has a preferred write performance preference.

10. The data storage device of claim 9, wherein the controller is configured to determine that the second LBA does not have a write performance preference.

11. The data storage device of claim 10, wherein the controller is configured to determine that the current word line needs EPWR.

12. The data storage device of claim 11, wherein the controller is configured to write the second LBA to the current word line with EPWR.

13. The data storage device of claim 8, wherein the controller is configured to determine that the first LBA does not have a preferred write performance preference.

14. The data storage device of claim 13, wherein the controller is configured to determine that the second LBA has a write performance preference.

15. The data storage device of claim 14, wherein the controller is configured to determine that the current word line needs EPWR.

16. The data storage device of claim 15, wherein the controller is configured to write the first LBA to the current word line with EPWR.

17. A data storage device, comprising:
   a memory device;
   means to determine whether LBAs have write performance preferences;
   means to determine whether a current word line of the memory device needs enhanced post write read (EPWR); and
   means to write LBAs to the current word line out of order based upon write performance preferences.

18. The data storage device of claim 17, further comprising means to update a translation table of a flash translation layer (FTL) based upon the means to write LBAs to the current word line out of order.

19. The data storage device of claim 17, further comprising:
   means to receive user write performance preferences for LBAs; and
   means to store user write performance preferences for LBAs.

20. The data storage device of claim 17, wherein the means to write LBAs to the current word line out of order is also based upon whether the current word line of the memory device needs EPWR.

* * * * *